(12) United States Patent
Walsworth et al.

(10) Patent No.: US 9,939,510 B2
(45) Date of Patent: Apr. 10, 2018

(54) USE OF NUCLEAR SPIN IMPURITIES TO SUPPRESS ELECTRONIC SPIN FLUCTUATIONS AND DECOHERENCE IN COMPOSITE SOLID-STATE SPIN SYSTEMS

(71) Applicants: Ronald L. Walsworth, Newton, MA (US); Nir Bar-Gill, Cambridge, MA (US); Chinmay Belthangady, Cambridge, MA (US); Linh My Pham, Cambridge, MA (US)

(72) Inventors: Ronald L. Walsworth, Newton, MA (US); Nir Bar-Gill, Cambridge, MA (US); Chinmay Belthangady, Cambridge, MA (US); Linh My Pham, Cambridge, MA (US)

(73) Assignee: PRESIDENT AND FELLOWS OF HARVARD COLLEGE, Cambridge, MA (US)

( * ) Notice: Subject to any disclaimer, the term of this patent is extended or adjusted under 35 U.S.C. 154(b) by 0 days.

(21) Appl. No.: 15/790,007

(22) Filed: Oct. 22, 2017

(65) Prior Publication Data
US 2018/0074149 A1  Mar. 15, 2018

Related U.S. Application Data

(62) Division of application No. 15/635,701, filed on Jun. 28, 2017, now Pat. No. 9,829,557, which is a division of application No. 14/361,626, filed as application No. PCT/US2012/067228 on Nov. 30, 2012, now Pat. No. 9,720,067.

(60) Provisional application No. 61/565,487, filed on Nov. 30, 2011.

(51) Int. Cl.
*G11C 11/00* (2006.01)
*G01R 33/58* (2006.01)
*G01R 33/12* (2006.01)
*G01R 33/24* (2006.01)

(52) U.S. Cl.
CPC ......... *G01R 33/58* (2013.01); *G01R 33/1284* (2013.01); *G01R 33/24* (2013.01)

(58) Field of Classification Search
CPC ...................................................... G11C 11/00
USPC .... 365/46, 94, 100, 129, 148, 152, 158, 163
See application file for complete search history.

(56) References Cited

U.S. PATENT DOCUMENTS 7,291,891 B2 * 11/2007 Machida ................ B82Y 10/00
   257/14
2005/0021927 A1 * 1/2005 Machida ................ B82Y 10/00
   712/32

* cited by examiner

*Primary Examiner* — Harry W Byrne
(74) *Attorney, Agent, or Firm* — Elizabeth Kim Patent Law Office LLC

(57) ABSTRACT

A solid state electronic spin system contains electronic spins disposed within a solid state lattice and coupled to an electronic spin bath and a nuclear spin bath, where the electronic spin bath composed of electronic spin impurities and the nuclear spin bath composed of nuclear spin impurities. The concentration of nuclear spin impurities in the nuclear spin bath is controlled to a value chosen so as to allow the nuclear spin impurities to effect a suppression of spin fluctuations and spin decoherence caused by the electronic spin bath. Sensing devices such as magnetic field detectors can exploit such a spin bath suppression effect, by applying optical radiation to the electronic spins for initialization and readout, and applying RF pulses to dynamically decouple the electronic spins from the electronic spin bath and the nuclear spin bath.

3 Claims, 7 Drawing Sheets

TABLE I

| | $^{12}$C | HPHT | Apollo |
|---|---|---|---|
| Meas. technique | ensemble | confocal | ensemble |
| N concentration | $\sim 1$ ppm | $\sim 50$ ppm | $\sim 100$ ppm |
| NV density | $\sim 10^{14} [\text{cm}^{-3}]$ | $\sim 10^{12} [\text{cm}^{-3}]$ | $\sim 10^{16} [\text{cm}^{-3}]$ |
| $^{13}$C concentration | 0.01% | 1.1% | 1.1% |
| Echo (1-pulse) $T_2$ | 240(6) $\mu$s | 5(1) $\mu$s | 2(1) $\mu$s |
| $T_2$ scaling | $n^{0.43(6)}$ | $n^{0.7(1)}$ | $n^{0.65(5)}$ |
| Max. achieved $T_2$ | 2.2 ms | 35 $\mu$s | 20 $\mu$s |
| $\Delta$ (expected) | $\approx 60$ kHz | $\approx 3$ MHz | $\approx 6$ MHz |
| $\Delta$ (measured) | 30(10) kHz | 1(1) MHz | 7(3) MHz |
| $\tau_c$ (expected) | $\approx 15$ $\mu$s | $\approx 0.34$ $\mu$s | $\approx 0.17$ $\mu$s |
| $\tau_c$ (measured) | 10(5) $\mu$s | 10(5) $\mu$s | 3(2) $\mu$s |
| FOM [ms/cm$^3$] | $2 \times 10^{14}$ | $10^{10}$ | $2 \times 10^{14}$ |

FIG. 3

USE OF NUCLEAR SPIN IMPURITIES TO SUPPRESS ELECTRONIC SPIN FLUCTUATIONS AND DECOHERENCE IN COMPOSITE SOLID-STATE SPIN SYSTEMS

CROSS-REFERENCE TO RELATED APPLICATIONS

The present application is a divisional of U.S. application Ser. No. 15/635,701, filed Jun. 28, 2017, which is a divisional of U.S. application Ser. No. 14/361,626, filed May 29, 2014. U.S. application Ser. No. 14/361,626 is a 35 U.S.C. § 371 National Phase Entry Application of International Application No. PCT/US2012/067228, filed Nov. 30, 2012, which designates the U.S., and which claims the benefit of priority under 35 U.S.C. § 119 to U.S. Provisional Application No. 61/565,487, filed Nov. 30, 2011 and entitled "Use of Spin Impurities to Suppress Spin Fluctuations and Decoherence in a Composite Solid-State Spin System." The contents of each of these applications are incorporated herein by reference in their entireties as though fully set forth.

STATEMENT REGARDING FEDERALLY SPONSORED RESEARCH

This invention was made with government support under contract number 60NANB10D002 awarded by NIST (National Institute of Standards and Technology), and under contract number HR0011-11-C-0073 awarded by DARPA (Defense Advanced Research Projects Agency).

BACKGROUND

Understanding and controlling the coherence of quantum spins in solid-state systems is crucial in areas such as precision metrology, quantum information science, and quantum many-body dynamics. A main source of decoherence for solid-state spin systems, such as defects in diamond, donors in silicon, and quantum dots, is the uncontrolled spin bath environment. Control of spin bath dynamics is a key challenge in practical applications, which include magnetometry and room temperature quantum computing.

For precision coherent measurements with ensembles of quantum spins the relevant Figure-of-Merit (FOM) is the product of spin density and coherence lifetime ($T_2$), which is generally limited by the dynamics of spin coupling to the environment. Significant effort has been invested in understanding the causes of decoherence in a diverse range of spin systems in order to increase the FOM and improve measurement sensitivity.

BRIEF DESCRIPTION OF THE DRAWINGS

The drawings disclose illustrative embodiments. They do not set forth all embodiments. Other embodiments may be used in addition or instead.

FIG. 3 is a table comparing key characteristics and extracted average-fit Lorentzian spin bath parameters for a number of NV– diamond samples.

DESCRIPTION

Figure 1A:
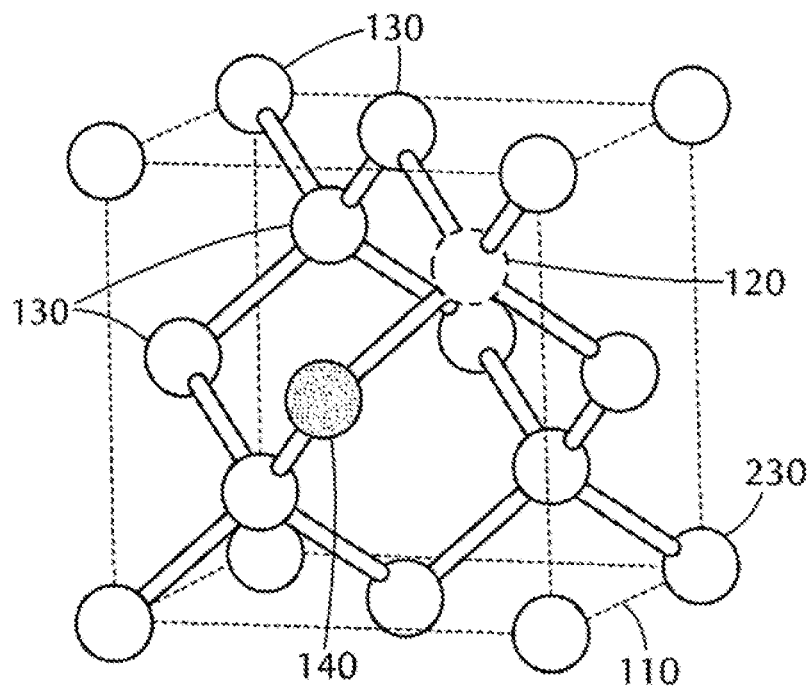
FIG. 1A illustrates the lattice structure of diamond that has a Nitrogen-Vacancy (NV) color center.

For magnetometry devices and other devices which rely on spin coherence, it is common practice (in the prior art) to reduce as much as possible the sources of decoherence, mainly other defects and spin impurities. Specifically for NV-based diamond devices, the goal has been to create ultrapure samples, with nitrogen (N) impurity concentrations below 1 ppb and $^{13}C$ impurity concentrations below 0.01%. However, increasing the concentration of NV spins is beneficial in increasing the signal-to-noise of such devices, and as a result the magnetometry sensitivity.

In the present application, "N" means "nitrogen", i.e. "N" and "nitrogen" have the same meaning and are used interchangeably.

Since an increase of NV concentration is fundamentally coupled with an increase in N concentration, the prior art states that the increase in signal-to-noise (due to higher NV concentration) is mitigated by reduced NV coherence times (due to higher N concentration).

In the present application, the inventors show that in such devices, in which the coherence time of the NV spins is limited by the N concentration, increasing the $^{13}C$ concentration to specific, optimal values, would not adversely affect the NV coherence time, but on the contrary would suppress the decoherence effects stemming from the N spin impurities.

Illustrative embodiments are discussed in this application. It should be understood that the invention is not limited to the particular embodiments described. The terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, a limited number of the exemplary methods and materials are described herein.

The negatively charged nitrogen-vacancy defect (NV⁻) in synthetic diamond material (also known as the NV color center) has attracted a lot of interest as a useful quantum spin defect because it has several desirable features including:

Its electron spin states can be coherently manipulated with high fidelity owing to an extremely long coherence time (which may be quantified and compared using the transverse relaxation time $T_2$ and/or $T_2^*$);

Its electronic structure allows the defect to be optically pumped into its electronic ground state allowing such defects to be placed into a specific electronic spin state even at non-cryogenic temperatures. This can negate the requirement for expensive and bulky cryogenic cooling apparatus for certain applications where miniaturization is desired. Furthermore, the defect can function as a source of photons which all have the same spin state; and Its electronic structure comprises emissive and non-emissive electron spin states which allows the electron spin state of the defect to be read out through photons. This is convenient for reading out information from synthetic diamond material used in sensing applications such as magnetometry, spin resonance spectroscopy and imaging. Furthermore, it is a key ingredient towards using the NV⁻ defects as qubits for long-distance quantum communications and scalable quantum computation. Such results make the NV⁻ defect a competitive candidate for solid-state quantum information processing (QIP).

FIG. 1A illustrates the lattice structure of diamond 110 that has a Nitrogen-Vacancy (NV) color center comprising a nitrogen atom 140 located adjacent a vacancy defect 120. As seen in FIG. 1A, the NV center is based in the lattice of carbon atoms 130, where two adjacent sites are altered, with one carbon atom being replaced with a nitrogen atom 140 and an adjacent lattice site being left vacant forming a lattice vacancy 120.

Figure 1B:
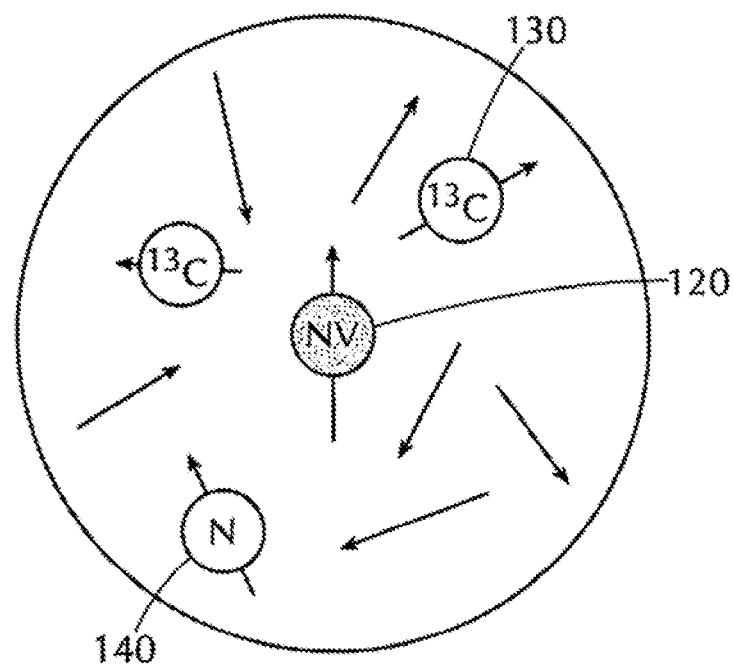
FIG. 1B illustrates the magnetic environment of the electronic spin of the NV color center shown in FIG. 1A, including $^{13}C$ nuclear spin impurities and nitrogen (N) electronic spin impurities.

FIG. 1B illustrates the magnetic environment of the electronic spin of an NV color center 125, including ¹³C nuclear spin impurities 135 and nitrogen electronic spin impurities 145. Generally, the NV centers 125 are sparsely located throughout the diamond lattice. N electronic spin impurities 145 are randomly scattered throughout the diamond lattice. The ¹³C nuclear spin impurities 135 typically are much higher in number, compared to the N spin impurities 145. Interactions between the NV center spins 125 and their environment, comprised of the N electronic and ¹³C nuclear spin impurities 135 and 145, causes dephasing and reduces the spin coherence time $T_2$ of the NV center electronic spins. The N electronic and ¹³C nuclear spin impurities effectively form a spin bath in which the NV center electronic spins are disposed. The spin impurities 135 and 145 of the spin bath cause the electronic spins of the NV centers 125 to flip and lose their coherence and hence the information stored in the NV center spins.

Figure 1C:
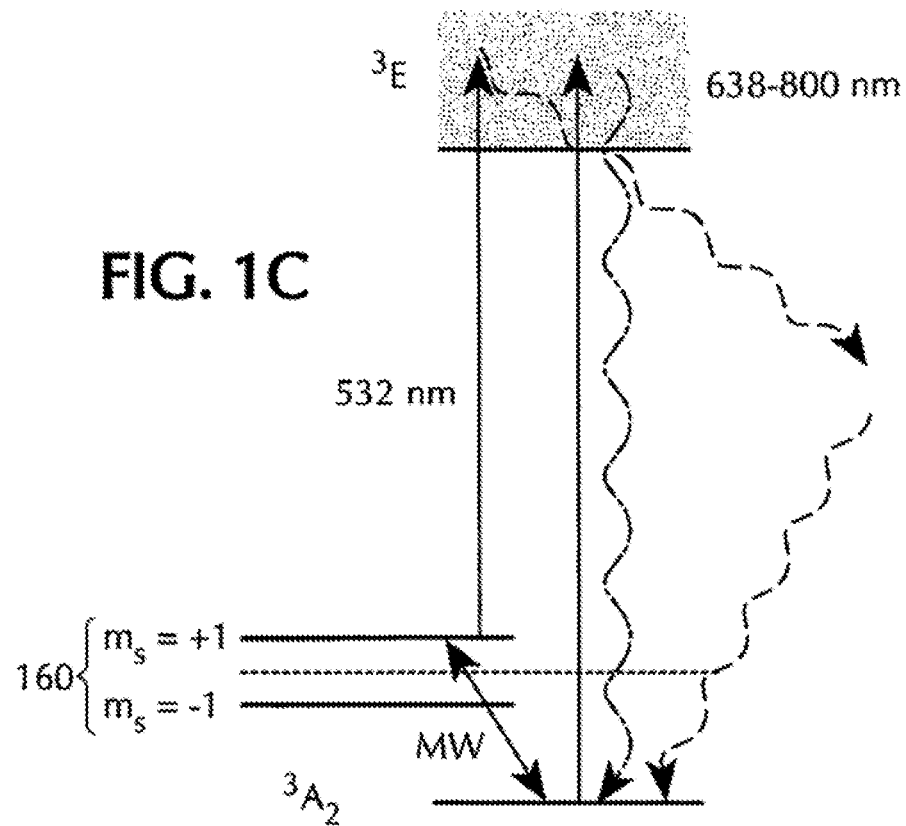
FIG. 1C illustrates the energy-level schematics of the NV center electronic spin.

FIG. 1C illustrates the energy-level schematics of the NV center electronic spin. As shown in FIG. 2B, the fine structure of the electronic ground state of an NV center is an $m_s=\pm 1$ spin triplet 160, with a $\Delta=2.87$ GHz crystal field splitting. In the absence of an external field, the spin-spin interactions between the two unpaired electrons at the NV center further split the triplet into $m_s=0$ state with A1 symmetry and $m_s=\pm 1$ states with E symmetry, which are separated by 2.87 GHz. An external field causes a Zeeman shift between $m_s=+1$ and $m_s=-1$ states, which is determined by a gyromagnetic ratio $\gamma=2.8$ MHz/G. Thus, by applying a bias field, the degeneracy of the $ms=\pm 1$ states can be lifted and a pseudo spin-half system can be realized. The spin triplet ground state of the NV center can also be optically polarized into the $m_s=0$ state. Spin-state dependent fluorescence can then be used for readout.

Figure 1D:
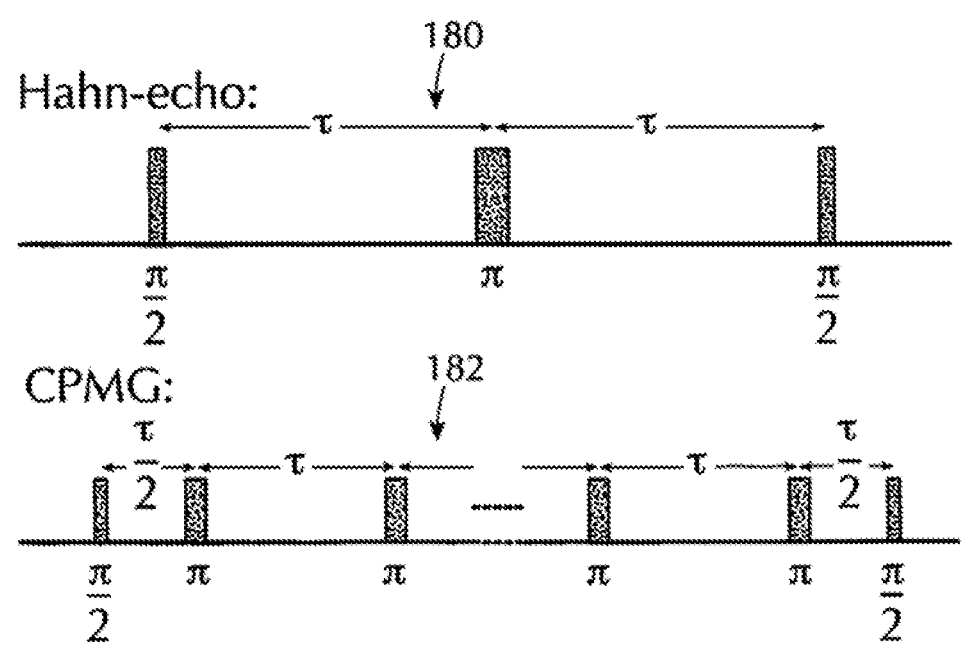
FIG. 1D illustrates Hahn-echo and multi-pulse (CPMG) spin-control sequences used to dynamically decouple the NV center electronic spins from their environments of spin baths.

FIG. 1D illustrates a Hahn-echo spin-control sequence 180 and a multi-pulse CPMG (Carr Purcell Meiboom Gill) spin-control sequence 182, combinations of which can be used to dynamically decouple the NV center electronic spins from their spin bath environment formed by the N electronic and ¹³C nuclear spin impurities. As seen in FIG. 1D, the CPMG pulse sequence 182 is an extension of the well-known Hahn-echo sequence, with n equally spaced π-pulses applied to the system after initially rotating it into the x-axis with a π/2 pulse.

In the present application, methods and systems are disclosed relating to an electronic spin bath suppression effect of nuclear spin impurities in a solid state spin system, including without limitation ¹³C nuclear spin impurities in a diamond lattice containing NV centers. It is shown that ¹³C nuclear spin impurities in fact also interact with the N (nitrogen) electron spin impurities, in such a way as to suppress the spin fluctuation and decoherence effects of nitrogen electronic spin defects on NV centers.

In relation to the above, it is known that both nitrogen electronic spin defects and ¹³C nuclear spin defects can adversely affect the quantum decoherence time of NV centers. As such, previous work in the field of quantum sensing and information processing has focused on reducing the concentration of nitrogen and ¹³C spin impurities to increase the decoherence time of NV center spin defects. This approach has proved advantageous for quantum sensing and information processing applications in which isolated NV spin defects with a very high decoherence time are desirable, e.g. for nanomagnetometry. However, for certain quantum sensing applications such as bulk magnetometry it can be advantageous to provide a large number of NV spin defects with each individual NV spin defect contributing to the sensitivity of the device.

To form such a large number of NV spin defects inevitably requires the introduction of a large number of nitrogen atoms into the diamond lattice with a portion of these nitrogen atoms pairing with vacancy defects to form the desired NV spin defects. However, this will inevitable result in a large concentration of residual nitrogen spin defects which, along with ¹³C spin impurities, adversely affect the decoherence time of the NV defects.

Surprisingly, the present inventors have found that the presence of ¹³C spin impurities located near nitrogen spin impurities reduces the adverse effect of the nitrogen spin impurities on the NV defects. While ¹³C nuclear spin impurities themselves adversely affect the NV defects, it has been found that the reduction in the adverse effect of the nitrogen spin impurities on the NV defects due to the presence of ¹³C nuclear spin impurities is larger than the adverse effect of the ¹³C nuclear spin impurities acting directly on the NV defects. As such, it has been found that for applications in which a large number of NV defects are desirable it is actually advantageous to provide ¹³C nuclear spin impurities within the crystal lattice rather than to remove these impurities as would be expected. This is completely contrary to prior art teachings that suggest that removal of ¹³C nuclear spin impurities is desirable to increase coherence times of NV defects. The inventors have termed this $^{13}$C induced reduction in adverse NV defect—spin bath interactions the spin bath suppression effect.

It may further be noted that using the aforementioned knowledge it is possible to engineer a materials so as to have an optimized level of nitrogen and $^{13}$C so as to optimize the spin bath suppression effect. In this regard, it may be noted that for diamond materials which have a very low level of nitrogen spin impurity, the adverse effect of $^{13}$C on NV centers becomes significant and thus in this instance it is still desirable to remove $^{13}$C from the diamond lattice to improve the spin coherence of the NV centers. However, as the concentration of nitrogen is increased in the diamond lattice then the adverse effect of $^{13}$C on NV centers becomes negligible when compared to the adverse effect of nitrogen on the NV centers and in this case increasing the $^{13}$C content has been found to reduce the adverse effect of nitrogen on the NV centers. Optimized materials will have a well-defined ratio of nitrogen to $^{13}$C to minimize adverse spin-bath interactions with NV defects such that increasing levels of nitrogen will require more $^{13}$C impurity to suppress interactions between the nitrogen and NV defects.

In addition to optimizing material compositions for quantum sensing and processing applications as described above, the spin bath suppression effect can be utilized to allow changes in how spin defects are addressed to improve device performance. As previously indicated, multi-pulse sequences such as the CPMG family of pulse sequences are used to dynamically decouple NV center electronic spins from their spin bath environment formed by the nitrogen electronic and $^{13}$C nuclear spin impurities and to achieve a required decoherence time for the NV defects.

Increasing the number of pulses increases dynamic decoupling and leads to increased coherence times for NV defects. However, increasing the number of pulses can increase power consumption and adversely affect functional performance of devices at least in certain applications. Optimizing materials to increase spin bath suppression can lead to an increase in the NV coherence times achieved for a particular level of pulse sequences or otherwise achieve a desired NV coherence time with a lower number of pulse sequences. As such, certain embodiments enable the use of a more efficient pulse sequence/frequency for a particular application.

A Figure-of-Merit (FOM) for precision coherent measurements with quantum spins is the product of the spin density ($n_{NV}$) and the coherence lifetime ($T_2$), with the phase-shift sensitivity $\delta\varphi$ scaling as:

$$\delta\phi \propto \frac{1}{\sqrt{n_{NV}T_2}} \equiv \frac{1}{\sqrt{FOM}}. \quad (1)$$

In order to increase the above FOM, the sources of decoherence in the solid-state spin system, and their interplay with spin density, must be addressed. In the solid state $T_2$ is typically limited by interaction with baths of paramagnetic spin impurities, whereas $n_{NV}$ is limited by fabrication issues and the associated creation of additional spin impurities in the environment.

In some embodiments of the present application, the FOM of ensembles of NV color centers in diamond are studied experimentally, as a system for precision spin metrology including without limitation magnetometry. In particular, spectral decomposition techniques are applied in order to characterize the dynamics of the composite solid-state spin bath that limits the NV electronic spin coherence time, consisting of both electronic spin (N) and nuclear spin ($^{13}$C) impurities.

In the present application, unexpectedly long correlation times were found for the electronic spin baths in two diamond samples with natural abundance of $^{13}$C nuclear spin impurities. An interplay between the electronic and nuclear spin baths can explain the long electronic spin bath correlation times that were found. In some embodiments, this discovery can be used to engineer diamond samples for optimized NV spin FOM, for applications that include without limitation precision magnetometry and collective quantum information applications. Furthermore, embodiments allow a targeted FOM to be achieved at lower RF pulse frequencies or otherwise achieve a higher FOM for a given RF pulse frequency.

In general, the coherence of a two-level quantum system can be related to the magnitude of the off-diagonal elements of the system's density matrix. Specifically, an ensemble of NV electronic spins in a finite external magnetic field can be treated as an effective two-level ensemble spin system with quantization (z) axis aligned with the nitrogen-vacancy axis. When the NV spins are placed into a coherent superposition of spin eigenstates, e.g., aligned with the x-axis of the Bloch sphere, the measurable spin coherence is given by $C(t)=T_r[\rho(t)S_x]$. Due to coupling of the NV spins to their magnetic environment, the coherence is lost over time, with the general form:

$$C(t)=e^{-\chi(t)}, \quad (2)$$

where the functional $\chi(t)$ describes the time dependence of the decoherence process.

In the presence of a modulation, including without limitation a resonant RF pulse sequence acting on the NV spins, described by a filter function in the frequency domain $F_t(\omega)$, the decoherence functional is given by:

$$\chi(t) = \frac{1}{\pi}\int_0^\infty d\omega S(\omega)\frac{F_t(\omega)}{\omega^2}, \quad (3)$$

where $S(\omega)$ is the spectral function describing the coupling of the system to the environment.

The above equation (3) holds in the approximation of weak coupling of the NV spins to the environment, which is appropriate for the dominantly electronic spin baths of the above-described diamond samples.

The spectral decomposition technique allows $S(\omega)$ to be determined from straightforward decoherence measurements of an ensemble of NV spins. If the magnitude of the coupling between the NV spins and the spin bath is described by a fluctuating energy term $\varepsilon(t)$, then $S(\omega)$ is the Fourier transform of the second order correlator of $\varepsilon(t)$:

$$S(\omega) = \frac{1}{\hbar^2}\int_0^\infty dt e^{i\omega t}\langle\varepsilon(0)\varepsilon(t)\rangle. \quad (4)$$

As seen from equation (3) above, if an appropriate modulation is applied to the NV spins such that $F_t(\omega)/(\omega^2 t)=\delta(\omega-\omega_0)$, i.e., if a Dirac $\delta$-function, or a close approximation thereto, is localized at a desired frequency $\omega_0$, then $\chi(t)=tS(\omega_0)/\pi$. Therefore, by measuring the time-dependence of the spin ensemble's coherence $C(t)$ when subjected to such a spectral $\delta$-function modulation, the spin bath's spectral component at frequency $\omega_0$ can be extracted:

$$S(\omega) = \frac{1}{\hbar^2} \int_0^\infty dt e^{i\omega t} \langle \varepsilon(0)\varepsilon(t) \rangle. \quad (5)$$

In some embodiments, a complete spectral decomposition of the spin environment is provided by repeating the above procedure for different values of $\omega_0$.

A close approximation to the ideal spectral filter function $F_t(\omega)$ described above can be provided by a variation on the well-known CPMG pulse sequence for dynamical decoupling of a spin system from its environment, illustrated in FIG. 1D. The resulting filter function for this sequence $F_{CPMG}(\omega)$ covers a narrow frequency region $\pi/t$, where t is total length of the sequence. This frequency range is centered at $\omega_0 = \pi n/t$, and is given by:

$$F_n^{CPMG}(\omega t) = 8\sin^2\left(\frac{\omega t}{2}\right) \frac{\sin^4\left(\frac{\omega t}{4n}\right)}{\cos^2\left(\frac{\omega t}{2n}\right)}. \quad (6)$$

The narrow-band feature of the CPMG filter essentially defines the effectiveness of this sequence for dynamical decoupling. A deconvolution procedure can be applied to correct for deviations of this filter function from the ideal Dirac δ-function.

In the above-discussed example, the composite solid-state spin environment is dominated by a bath of fluctuating N electronic spin impurities, which causes decoherence of the probed NV spins through magnetic dipolar interactions. In the regime of low external magnetic fields and room temperature, the bath spins are randomly oriented, and their flip-flops or spin state exchanges can be considered as random uncorrelated events. Therefore, the resulting spectrum of the bath's coupling to the NV spins can be reasonably assumed to be Lorentzian:

$$S(\omega) = \frac{\Delta^2 \tau_c}{\pi} \frac{1}{1 + (\omega \tau_c)^2}. \quad (7)$$

This spin bath spectrum is characterized by two parameters: $\Delta$, the average coupling strength of the bath to the probed NV spins; and $\tau_c$, the correlation time of the bath spins with each other, which is related to their characteristic flip-flop time. In general, the coupling strength $\Delta$ is given by the average dipolar interaction energy between the bath spins and the NV spins, while the correlation time $\tau_c$ is given by the inverse of the dipolar interaction energy between neighboring bath-spins. Since such spin-spin interactions scale as $1/r^3$, where r is the distance between the spins, it is expected that the coupling strength scales as the bath spin density $n_{spin}$, i.e. $\Delta \propto n_{spin}$, and the correlation time scales as the inverse of this density (i.e., $\tau_c \propto 1/n_{spin}$).

The multi-pulse CPMG sequence used in the above-described spectral decomposition technique also extends the NV spin coherence lifetime by suppressing the time-averaged coupling to the fluctuating spin environment. In general, the coherence lifetime $T_2$ increases with the number of pulses n employed in the CPMG sequence. For a Lorentzian bath, in the limit of very short correlation times $\tau_c \ll T_2$, the sequence is inefficient and $T_2 \propto n^{2/3}$ (no improvement with number of pulses). In the opposite limit of very long correlation times $\tau_c \gg T_2$, the scaling is $T_2 \propto n^{2/3}$.

In one or more embodiments of the present application, the $|0\rangle$-$|1\rangle$ spin manifold of the NV triplet electronic ground-state is manipulated using a static magnetic field and microwave pulses, and employing a 532 nm laser to initialize and provide optical readout of the NV spin state.

Figure 2:
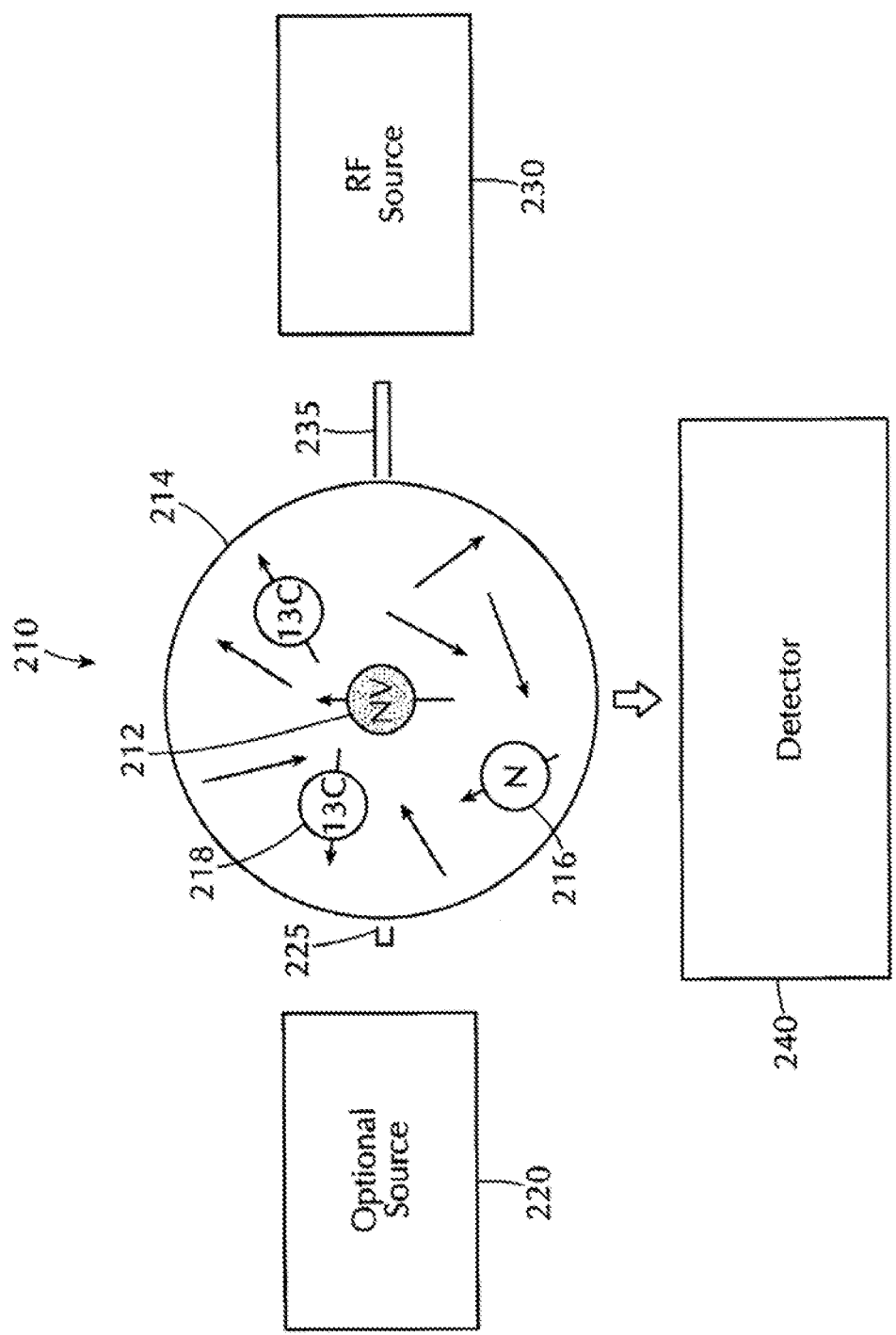
FIG. 2 is a schematic block diagram of a system that implements electronic spin bath suppression using nuclear spin impurities, in accordance with one or more embodiments of the present disclosure.

FIG. 2 is a schematic block diagram of a system 200 that implements electronic spin bath suppression using nuclear spin impurities, in accordance with one or more embodiments of the present disclosure. In overview, the system 200 includes a sample 210, which is solid state electronic spin system containing one or more electronic spins 212 (e.g. NV spin defects) disposed within a room-temperature solid state lattice 214 (e.g. diamond), and coupled to an electronic spin bath 216 (e.g. nitrogen electronic spin defects) and a nuclear spin bath 218 (e.g. $^{13}$C nuclear spin defects); an optical source 220 configured to generate optical radiation 225 for initialization and readout of the electronic spins (e.g. NV) in the solid state lattice; an RF source 230 configured to generate RF pulse sequences configured to dynamically decouple the electronic spins from the electronic spin bath (e.g. N) and the nuclear spin bath (e.g. $^{13}$C); and 240 a detector configured to detect output optical radiation correlated with the electronic spins, after the electronic spins have been subject to the optical excitation radiation and the external control, so as to detect a variable of interest.

In some embodiments, the electronic spin bath 216 is composed of electronic spin impurities and the nuclear spin bath 218 is composed of nuclear spin impurities. The concentration of the nuclear spin impurities in the nuclear spin bath 218 is chosen so that the nuclear spin impurities can effect a suppression of spin fluctuations and spin decoherence of one or more electronic spin defects of interest (e.g. NV spin defects) caused by the electronic spin bath.

A processing system (not shown) may be integrated with, or connected to, the above system, and is configured to perform the above-mentioned computations relating to spectral decomposition techniques. The processing system is configured to implement the methods, systems, and algorithms described in the present application. The processing system may include, or may consist of, any type of microprocessor, nanoprocessor, microchip, or nanochip. The processing system may be selectively configured and/or activated by a computer program stored therein. It may include a computer-usable medium in which such a computer program may be stored, to implement the methods and systems described above. The computer-usable medium may have stored therein computer-usable instructions for the processing system. The methods and systems in the present application have not been described with reference to any particular programming language; thus it will be appreciated that a variety of platforms and programming languages may be used to implement the teachings of the present application.

The above-described spectral decomposition techniques have been applied to three diamond samples with differing NV densities and concentrations of electronic and nuclear spin impurities. The spin bath parameters $\Delta$ and $\tau_c$ as well as the NV spin coherence FOM have been extracted for the three samples.

FIG. 3 is a table comparing key characteristics and extracted average-fit Lorentzian spin bath parameters for three NV-diamond samples.

Sample 1 is an isotopically pure $^{12}$C diamond sample grown via a chemical vapor deposition (CVD) technique (fabricated by Element 6). This sample has a very low concentration of $^{13}$C nuclear spin impurities (0.01%), a moderate concentration of N electronic spin impurities (~1 ppm (parts per million)), and a moderate NV density (~$10^{14}$ cm$^{-3}$). This sample was studied using an NV ensemble microscope.

Sample 2 is a type 1b high pressure high-temperature (HPHT) diamond sample (fabricated by Element 6) with a natural $^{13}$C concentration, a high N concentration (~50 ppm), and a low NV density (~$10^{12}$[cm$^{-3}$]). This sample was studied using a confocal apparatus able to measure single NV centers.

Sample 3 is a thin-layer CVD diamond sample (fabricated by Apollo) with a natural $^{13}$C concentration (1.1%), a high N concentration (~100 ppm), and a large NV density (~$10^{16}$ cm$^{-3}$). This sample was studied using the NV ensemble microscope.

In Sample 1, the overall spin environment for the probed NV spins is expected to be simply described by a bath of N electronic spin impurities, and because of its combination of insignificant nuclear spin impurities and moderate electronic spin impurity concentration, a large FOM value is expected.

Sample 3 is selected for characterization in order to compare the NV spin coherence FOM at high N concentration and NV density with the FOM at moderate N concentration and NV density in the $^{12}$C sample.

Characterization of Sample 2 is designed to confirm that similar electronic spin bath dynamics are determined by the spectral decomposition technique for single NV spins and NV ensembles in the high N concentration limit, even though a small FOM value is expected due to the low NV density of the HPHT sample.

Both the HPHT and Apollo samples have a natural 1.1% abundance of $^{13}$C nuclear spin impurities: two orders of magnitude higher density than in the $^{12}$C diamond sample. Nonetheless, for the high N concentration in the HPHT and Apollo samples, the simple physical picture outlined above, of NV electronic spins coupled to independent N electronic and $^{13}$C nuclear spin baths, implies that the spin environment and NV spin decoherence should still be dominated by the bath of N electron spins.

A best-fit Lorentzian spin bath spectrum can be fitted to the average of all data points, which included derived values for the spin bath spectral functions $S_n(\omega)$ for all CPMG pulse sequences, average values at each frequency, best fit Lorentzian for the mean spectral function $S_n(\omega)$, and range of best-fit Lorentzians for the individual spectral functions $S_n(\omega)$ for each CPMG pulse sequence. The resulting best-fit Lorentzian had a coupling strength of $\Delta=30\pm10$ kHz and correlation time $\tau_c=10\pm5$ µs. This agrees well with the range of values found for the Lorentzian spin bath spectra $S_n(w)$, fit to each pulse sequence separately, $\Delta\cong30$-$50$ kHz, $\tau_c\cong5$-$15$ µs. The above values are also in reasonable agreement with the expected N dominated bath values for $\Delta$ and $\tau_c$, given the $^{12}$C NV-diamond sample's estimated concentrations of $^{13}$C and N spins, as shown in Table I of FIG. 3.

Figure 4:
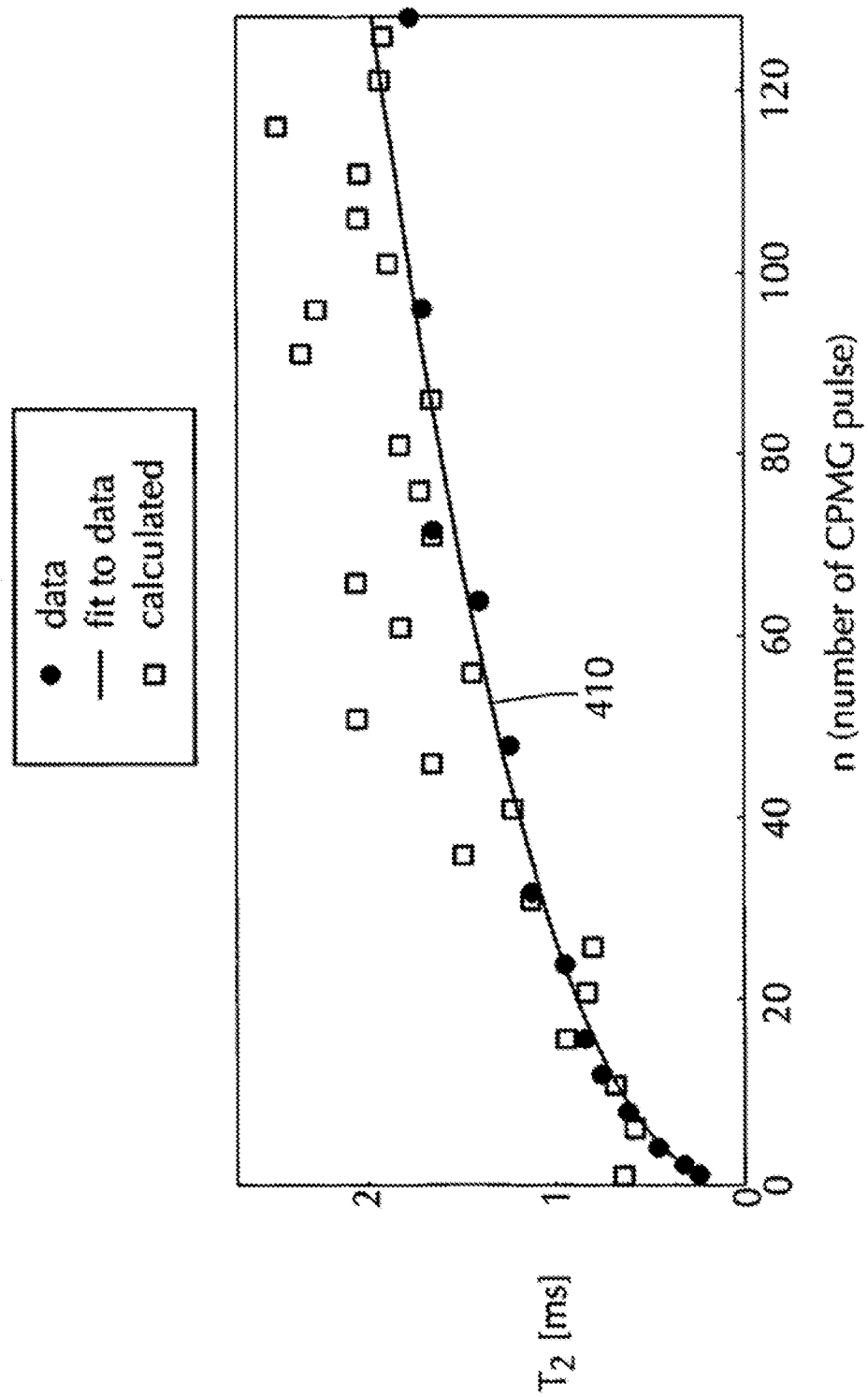
FIG. 4 illustrates an application of the spectral decomposition technique to an isotopically pure $^{12}C$ NV-diamond sample.

FIG. 4 illustrates the scaling of $T_2$ with the number n of CPMG pulses. In particular, FIG. 4 plots the NV spin coherence lifetime $T_2$, determined from the measured coherence decay $C_n(t)$ for an n pulse CPMG control sequence, as a function of the number of CPMG pulses out to n=128, illustrated by the dots in FIG. 4. FIG. 4 further plots a power-law fit to this relationship, from which the scaling $T_2 \propto n^{0.43(6)}$ is found (solid line 410). This power law exponent <2/3 is consistent with the spin bath $\tau_c$ being about an order of magnitude smaller than the Hahn-echo $T_2$ for the $^{12}$C diamond sample, as seen in Table I in FIG. 3. The maximal coherence time achieved using a 512-pulse CPMG sequence was 2.2 ms, as seen in Table I shown in FIG. 3.

To check the consistency of the data analysis procedure and assumptions, the best-fit Lorentzian spin bath spectrum can be used as an input to calculate the $T_2$ (n) scaling by synthesizing an NV spin coherence decay $C_n(t)$ for each CPMG pulse sequence; and then fit to find $T_2$ for each synthesized $C_n(t)$, shown as empty squares in FIG. 4. From this process a scaling $T_2 \sim n^{0.4(1)}$ can be extracted, and is in good agreement with the scaling derived directly from the $C_n(t)$ data.

Figure 5A:
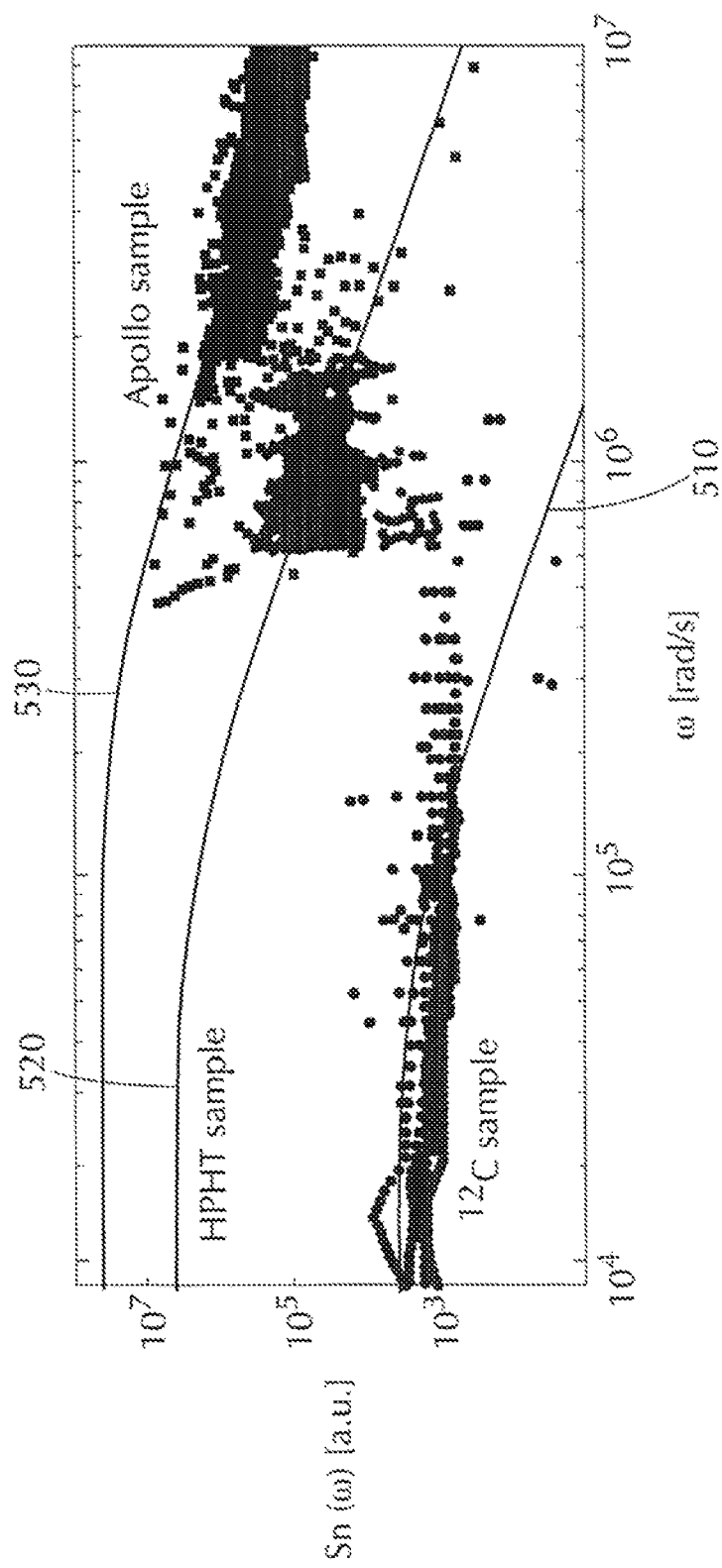
FIGS. 5A and 5B illustrate a comparative application of the spectral decomposition technique to three types of NV-diamond samples.
Figure 5B:
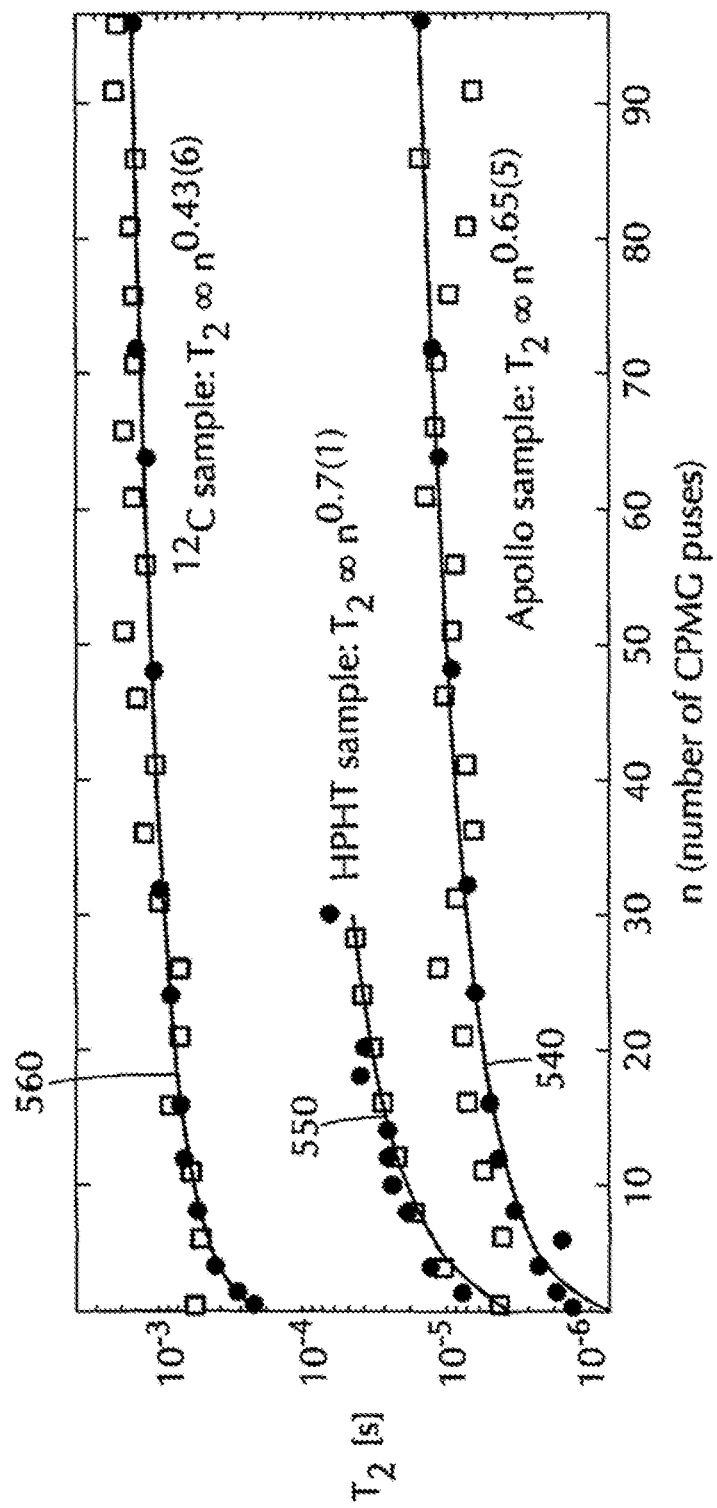

FIGS. 5A and 5B illustrate the results of the spectral decomposition procedure for all three samples. FIG. 5A plots the derived spin bath spectral functions $S_n(\omega)$ and associated Lorentzian fits. The spin bath spectral functions and associated Lorentzian fits using the average-fit method are shown as solid lines 510 ($^{12}$C sample), 520 (HPHT sample), and 530 (Apollo sample), respectively.

FIG. 5B shows the measured scaling of $T_2$ with the number of CPMG pulses. From the full set of data for each sample, the coupling strength and correlation time of the best average-fit Lorentzian can be extracted, then verified to recreate correctly the decoherence curves and the $T_2$ scaling, using the synthesized data procedure described above. In FIG. 5B, the data shown in dots are derived from NV spin coherence decay data $C_n(t)$, for each of the three samples. The solid lines 540 (Apollo sample), 550 (HPHT sample), and 560 ($^{12}$C sample) illustrate a fit of the dots to a power law, for each sample. The data shown as open squares in FIG. 5B are synthesized from the average-fit Lorentzian spin bath spectrum.

As seen in the bottom row of the table in FIG. 3, extremely large values were obtained for the spin coherence FOM~$2\times10^{14}$ m$_s$/cm$^3$ for the $^{12}$C and Apollo samples. These FOM values are about three orders of magnitude larger than previously obtained in other room temperature solid-state systems, with either single spins or ensembles. These FOM values would make it possible to significantly improve precision spin metrology, including without limitation magnetometry using NV diamond.

The similarly large FOM values for the $^{12}$C and Apollo samples are qualitatively consistent with the trade-off of increased NV density causing correspondingly decreased $T_2$ due to increased N impurity concentration, or a similar N-to-NV conversion efficiency ~0.1% for these CVD samples. The HPHT sample has very low N-to-NV conversion efficiency and a much smaller FOM.

Also as seen in Table I, there is reasonable agreement between the measured and expected values for the coupling strength $\Delta$ in all three NV-diamond samples, with A scaling approximately linearly with the N concentration. Similarly, the measured and expected values for the correlation time $\tau_c$ agree well for the $^{12}$C sample with low N concentration. The qualitative agreement between the results of the Apollo and HPHT samples indicates that the measured behavior of the electronic spin bath at high N concentration is not an artifact of the few NVs measured in the HPHT sample, and is not related to ensemble averaging in the Apollo sample.

The surprisingly long spin bath correlation times for the $^{13}$C diamond samples, revealed by applying spectral decomposition techniques, imply a suppression of the electronic N (nitrogen) spin bath dynamics at certain nuclear spin ($^{13}$C) concentrations. This suppression can be explained to be a result of the random, relative detuning of electronic spin energy levels due to interactions between proximal electronic and nuclear spin impurities.

The $^{13}$C nuclear spins create a local Overhauser field for the N electronic spins, which detunes the energy levels of neighboring N spins from each other, depending on their random relative proximity to nearby $^{13}$C spins. This detuning then suppresses the flip-flops of N spins due to energy conservation, effectively increasing the correlation time of the electronic spin bath in the presence of a finite concentration of nuclear spin impurities, compared to the correlation time in the $^{12}$C sample.

The ensemble average effect of the composite electronic-nuclear spin bath interaction is to induce an inhomogeneous broadening ΔE of the N resonant electronic spin transition. The electronic spin flip-flop rate R is modified by this inhomogeneous broadening according to the expression:

$$R \simeq \frac{\pi}{9} \frac{\Delta_N^2}{\Delta E}, \qquad (8)$$

where $\Delta_N$ is the dipolar interaction between N (nitrogen) electronic spins. In this physical picture, ΔE is proportional to the concentration of $^{13}$C impurities and to the hyper-fine interaction energy between the N (nitrogen) electronic and $^{13}$C nuclear spins, whereas $\Delta_N$ is proportional to the N concentration. Taking into account the magnetic moments and concentrations of the N (nitrogen) electronic and $^{13}$C nuclear spin impurities in the above samples, and the large contact hyperfine interaction for N impurities in diamond, ΔE is estimated to be around~10 MHz and $\Delta_N$~1 MHz, for the HPHT and Apollo samples. This estimate implies approximately an order of magnitude suppression of R compared to the bare flip-flop rate ($R_{bare}$~$\Delta_N$), which is consistent with the long spin bath correlation times for the $^{13}$C diamond samples, as revealed by the results of the spectral decomposition technique displayed in Table I in FIG. 3.

To summarize, methods and systems have been described relating to the applications of a spectral decomposition technique to NV-diamond samples with different composite-spin environments to characterize the bath dynamics and determine the NV spin coherence FOM. For samples with a finite concentration of $^{13}$C nuclear spin impurities (1.1%), a significant suppression of the N electronic spin bath dynamics was discovered—an order of magnitude increase in the spin bath correlation time relative to the expected value.

Such a spin bath suppression effect can be explained by inhomogeneous broadening of the N electronic spin transition due to interactions between proximal electronic and nuclear spin impurities. For two CVD grown samples, with low and natural concentrations of $^{13}$C, a CPMG dynamic de-coupling technique can be applied to realize a FOM~2× $10^{14}$ ms/cm$^3$ for each sample. This is three orders of magnitude larger than previous results in room temperature solid-state systems. This NV FOM value is within one order of magnitude of the largest spin coherence FOM achieved in atomic systems—an atomic vapor SERF (Spin Exchange Relaxation Free) magnetometer—but has the advantage that it has been achieved in a solid state system.

The effective NV spin coherence time achieved with the $^{12}$C sample, i.e. 2.2 ms for 512 CPMG pulses, is nearly $T_1$ limited, and comparable to the best coherence times achieved with single NV spins. This suggests possible applications in collective quantum information processing.

It should be noted that the high FOM and $T_2$ values discussed above were obtained for the 1 ppm and 100 ppm nitrogen containing diamond samples due to the combination of two factors: (i) the ratio of nitrogen to $^{13}$C in each of these samples was fortuitously close to an optimized range to take advantage of the previously unknown spin bath suppression effect of the $^{13}$C nuclear spin defects on the nitrogen electronic spin defects; and (ii) the use of a suitable CPMG RF pulse sequence for these samples to dynamically decouple the NV defects from the spin bath, the pulse sequence comprising a relatively high number of pulses (n=512). However, it should also be noted that now the spin bath suppression effect has been identified it will be possible to make further improvements for the FOM and $T_2$ values by optimizing the ratio of nitrogen to $^{13}$C and by optimizing RF pulse sequences for use with such optimized materials as described below.

By numerically calculating the effect of randomly distributed $^{13}$C impurities with a given concentration (using a Monte-Carlo based approach), one can extract optimal values for these concentrations, up to a factor of ~2-3 given the stochastic nature of this suppression, giving the following values for varying nitrogen concentration:

| [N] (ppm) | [13C] (%) | [N] (ppm)/[13C] (%) |
|---|---|---|
| 1 | 0.01 | 100 |
| 10 | 0.1 | 100 |
| 100 | 1 | 100 |
| 1000 | 10 | 100 |
| 10000 | 100 | 100 |

At 10,000 ppm N, the average N—N interaction is ~400 MHz, which exceeds the maximal hyperfine contact interaction with a nearest neighbor $^{13}$C, which is ~240 MHz. Therefore, this would appear to be approximately the limit for the spin bath suppression effect.

In light of the above, the nitrogen concentration and the $^{13}$C concentration of the diamond material may be controlled during synthesis such that the nitrogen to $^{13}$C ratio, [N](ppm)/$^{13}$C (%) is in a range 1 to 500, 10 to 400, 20 to 300, 30 to 200, 40 to 150, or 50 to 150 with an optimal value of around 100. It should be noted that references to nitrogen concentration made herein refer to single substitutional nitrogen.

For certain applications it will be advantageous to provide a nitrogen concentration greater than 100 ppm. As such, for these applications it will be advantageous to increase the $^{13}$C concentration above a natural abundance of 1.1%. For example, for certain applications the nitrogen concentration may be equal to or greater than greater than 150 ppm, 200 ppm, 300 ppm, 500 ppm, 750 ppm, or 1000 ppm. In practice the highest nitrogen concentrations in a diamond material will be limited by the synthesis technique. As such, the nitrogen concentration may be equal to or less than 10000 ppm, 5000 ppm, 2000 ppm, or 1000 ppm. For example, the nitrogen concentration may be in a range 150 ppm to 10000 ppm, 200 ppm to 5000 ppm, 300 ppm to 2000 ppm, or 500 ppm to 1000 ppm. The $^{13}$C concentration may be equal to or greater than 1.5%, 2%, 3%, 5%, 7%, or 10%. Furthermore, the $^{13}$C concentration may be equal to or less than 100%, 75%, 50%, 30%, 20%, or 15%. For example, the $^{13}$C concentration may be in a range 1.5% to 20%, 2% to 17%, 3% to 15%, 4% to 12%, 5% to 10%, or 8% to 10%.

In certain other applications it will be advantageous to provide a nitrogen concentration less than 100 ppm. As such, for these applications it will be advantageous to decrease the $^{13}$C concentration below a natural abundance of 1.1%. For example, for certain applications the nitrogen concentration may be equal to or greater than greater than 1 ppm, 5 ppm, 10 ppm, 20 ppm, 50 ppm, or 70 ppm. Furthermore, the nitrogen concentration may be equal to or less than 80 ppm, 60 ppm, 40 ppm, 20 ppm, or 10 ppm. For example, the nitrogen concentration may be in a range 1 ppm to 80 ppm, 5 ppm to 80 ppm, 10 ppm to 80 ppm, or 20 ppm to 80 ppm. The $^{13}$C concentration may be equal to or greater than 0.02%, 0.05%, 0.10%, 0.2%, 0.3%, 0.5% or 0.7%%. Furthermore, the $^{13}$C concentration may be equal to or less than 0.8%%, 0.6%%, 0.4%, 0.25%, 0.15%, 0.10% or 0.75%. For example, the $^{13}$C concentration may be in a range 0.02% to 0.8%%, 0.05% to 0.6%, or 0.10% to 0.4%.

In addition to the above, in order to further improve $T_2$ and the FOM for NV defects in diamond material it is desirable that the ratio of NV defects to nitrogen defects is high. In both the previously discussed $^{12}$C and Apollo samples the ratio [NV](ppm)/[N](ppm) is approximately $5\times10^{-4}$. It is known that the ratio of NV to N can be increased by controlling diamond growth conditions and/or by applying post growth treatments to the diamond material. For example, diamond material can be annealed, or irradiated and then annealed, to convert isolated nitrogen defects into nitrogen vacancy defect thus increasing the ratio of NV to N. These techniques can thus be applied in combination with N and $^{13}$C optimization to engineer a material which has optimized levels of N, $^{13}$C, and NV. The ratio of [NV](ppm)/[N](ppm) may be equal to or greater than $1\times10^{-3}$, $5\times10^{-3}$, $1\times10^{-2}$, or $5\times10^{-2}$. The upper value for the ratio will depend on the synthesis technique and/or the treatment technique used to form the NV defects. As such, the ratio of [NV](ppm)/[N](ppm) may be equal to or less than 1, $5\times10^{-1}$, or $1\times10^{-1}$.

It should also be noted that the NV and N defects discussed herein may be distributed throughout a diamond sample or may be provided in a thin layer disposed within a diamond lattice (e.g. by implantation of N atoms and annealing to form a layer of NV defects). In the case that the NV and N defects are located within a thin layer then the defect concentrations discussed above apply to the thin layer. The surrounding or supporting diamond material may then be fabricated to have a different composition.

The aforementioned discussion focusses on optimization of diamond material characteristics to take advantage of the spin bath suppression effect. A further discussion of both the RF pulse sequences used to identify the spin bath suppression effect via spectral decomposition and modifications which can be made to more conventional RF pulse sequences in device applications which will utilize the spin bath suppression effect is set out below.

The spectral decomposition technique described herein for identifying the spin-bath suppression effect employs a different combination of RF pulses than the "conventional" dynamic decoupling sequences. Specifically, to employ conventional dynamical decoupling to enhance the NV $T_2$ (coherence time) entails using as a large number of, and as frequent, RF pulses as possible. In contrast, to perform spectral decomposition on a particular NV-diamond sample, one must span the largest possible frequency spectrum in order to identify the noise sources that cause NV decoherence. Thus one employs a tailored matrix of RF pulse sequences, with: (i) both frequent and infrequent RF pulses; and (ii) both short and long total RF pulse sequence durations. Then, to extract useful information from the spectral decomposition measurements, an additional analysis step is required: the measured NV decoherence data is numerically deconvolved from the actual RF pulse sequence filter function, such that the desired noise spectrum information is extracted. This spectral decomposition technique (measurements and analysis) is distinct in detail and purpose from the procedure used in conventional dynamical decoupling.

The aforementioned spectral decomposition technique has been used by the present inventors to identify the spin-bath suppression effect, by which $^{13}$C nuclear spins suppress the N electronic spin dynamics (known as "flip-flops"), which results in longer than previously expected NV $T_2$ and FOM characteristics.

As a result of the identification of the spin-bath suppression effect, the present inventors have shown that an optimal choice of $^{13}$C concentration for a given N concentration translates into the ability to perform more efficient conventional dynamical decoupling sequences, i.e., it is possible to use less RF pulses in order to obtain a desired NV $T_2$ and FOM value. That is, because of the spin-bath suppression effect, one can spend less time applying conventional dynamical decoupling RF pulses to achieve the same NV $T_2$ than was previously realized, i.e., conventional dynamical decoupling sequences are made more efficient. In an NV-diamond magnetometer, this means that a given magnetometer performance can be realized with less RF pulses applied, meaning less power needed to drive the RF pulses in addition to other performance advantages for device applications associated with the use of a lower number and/or frequency of pulses.

The NV*$T_2$ product (FOM) can be analyzed as a function of N density, NV density and the number of pulses n in a multi-pulse sequence such as an CPMG sequence. For example, one may consider the NV density as a by-product of the N density, related by the conversion efficiency. In the ranges previously quote herein, a maximal conversion efficiency of 10% will be assumed for this analysis.

The N density determines the base $T_2$ (at least roughly), i.e. the $T_2$ for one pulse, which is denoted here as $T_2(1)$. The relation is approximately:

$$T_2(1) \sim 300\mu s/N \text{ density}[ppm]$$

So, 1 ppm N will give a $T_2(1) \sim 300$ µs, and 100 ppm N will give a $T_2(1) \sim 3$ µs.

Next, we address how $T_2(n)$ scales with the number of pulses n. This may be given by the equation:

$$T_2(n) = T_2(1) \times n^{(2/3)}$$

where $T_2(n)$ is the $T_2$ for an n pulse sequence, $T_2(1)$ is the $T_2$ for one pulse, and SF is a scaling factor. The optimal scaling factor SF is ⅔ (or 0.66) such that ideally:

$$T_2(n) = T_2(1) \times n^{(2/3)}$$

With the optimal concentration of $^{13}$C it is possible to achieve a scaling factor SF that is close to the optimal scaling of ⅔. As such, according to embodiments of the present invention the scaling factor SF may be equal to or greater than 0.55 or 0.6 and as a result it is possible to reach a large NV×$T_2(n)$ product for a small number of pulses.

This scaling holds until $T_2$ saturates at the $T_1$ limit, which is a few milliseconds at room temperature. This becomes less of an issue as one increases the N concentration since reaching the $T_1$ limit is then impractical.

Since both the NV density and $T_2(1)$ depend on the N density, the NV×$T_2(n)$ product can be rewritten as:

$$NV \times T_2(n) \sim 0.1 \times [N] \times (300\mu s/[N]) \times n^{(2/3)} \sim 5 \times 10^{15} \times n^{(2/3)} [M_s/cm^3]$$

The essence here is that one is encompassing the high NV concentration (10% conversion efficiency) and the optimal scaling with the number of pulses n (a scaling of ⅔). For example, for 1 ppm N, and assuming an NV density of 0.1 ppm, the base $T_2$ is $T_2(1) \sim 300$ µs. Here a factor of 10 improvement in $T_2$ will already bring us to saturation. A factor of 10 can be achieved with n=32 pulses given the optimal scaling. In this case one may state that $NV \times T_2 > 10^{16}$ [$m_s/cm^3$] with n<60.

For anything that has an N density above [N]>10 ppm it is impractical to reach the saturation limit, and then one can state that $NV \times T_2(n) > 5 \times 10^{15} \times n^{(0.55)}$.

For larger numbers of pulses, then $NV \times T_2(n) > 10^{17}$ with n<1000.

In light of the above, it will be evident that by suitable materials engineering it is possible to achieve a figure of merit (FOM) given by $NV \times T_2(n)$ [$m_s/cm^3$] equal to or greater than $5 \times 10^{14}$, $1 \times 10^{15}$, $5 \times 10^{15}$, $1 \times 10^{16}$, $5 \times 10^{16}$, or $1 \times 10^{17}$ using an RF pulse sequence with a number of pulses n less than or equal to 1000, 800, 600, 400, 200, 100, 80 or 60. For example, $NV \times T_2(n)$ [ms/cm$^3$] may be equal to or greater than $5 \times 10^{14}$, $5 \times 10^{15}$, or preferably $1 \times 10^{16}$ with a number of pulses n less than or equal to 400, 200, 100, 80 or 60. Furthermore, $NV \times T_2(n)$ [ms/cm$^3$] may be equal to or greater than $5 \times 10^{16}$ or preferably $1 \times 10^{17}$ with a number of pulses n less than or equal to 1000, 800, 600, or 400. The number of pulses n may have a lower limit of 10, 20, 30, 50, 100, 200, 300, or 400 depending on the specific levels of N, NV and $^{13}C$ according to different embodiments of the invention. In practice for certain applications it can be advantageous to make the FOM as high as possible for a realistic number of pulses. In practice, the FOM is likely to be no higher than $1 \times 10^{20}$, $1 \times 10^{19}$, or $1 \times 10^{18}$.

The aforementioned discussion has focused on diamond materials. However, the present inventors consider that the spectral decomposition techniques presented in the present application, based on pulse sequences and a reconstruction algorithm, can be applied to other composite solid-state spin systems so as to exploit the spin bath suppression effect of nuclear spin impurities. These other solid-state spin systems include, without limitation, quantum dots and phosphorous donors in silicon. Such measurements may provide a powerful approach for the study of many-body dynamics of complex spin environments, and make the identification of optimal parameter regimes possible for a wide range of applications in quantum information science and metrology.

Nothing that has been stated or illustrated is intended to cause a dedication of any component, step, feature, object, benefit, advantage, or equivalent to the public. While the specification describes particular embodiments of the present disclosure, those of ordinary skill can devise variations of the present disclosure without departing from the inventive concepts disclosed in the disclosure. While certain embodiments have been described, it is to be understood that the concepts implicit in these embodiments may be used in other embodiments as well. In the present disclosure, reference to an element in the singular is not intended to mean "one and only one" unless specifically so stated, but rather "one or more." All structural and functional equivalents to the elements of the various embodiments described throughout this disclosure, known or later come to be known to those of ordinary skill in the art, are expressly incorporated herein by reference.

What is claimed is:

1. A method comprising:
   introducing nuclear spin impurities into a solid state spin system that includes electronic spins coupled to a spin bath of electronic spin impurities and nuclear spin impurities;
   wherein the concentration of the nuclear spin impurities is chosen so as to allow the magnetic interactions between the nuclear spin impurities and the electronic spin impurities to shift the energy levels of the electronic spin impurities relative to each other and remove the degeneracy in the energy levels, thereby substantially suppressing the spin flipping caused by the electronic spin impurities and substantially increasing the spin coherence lifetime of the electronic spins.

2. The method of claim 1, wherein the electronic spins comprise NV centers in diamond, the electronic spin impurities comprise N atoms in diamond, and the nuclear spin impurities comprise $^{13}C$ isotopes in diamond.

3. The method of claim 1, wherein the act of introducing the nuclear spin impurities into the solid state spin system comprises performing chemical vapor deposition.

* * * * *